United States Patent
Shivaraman et al.

(10) Patent No.: US 11,653,502 B2
(45) Date of Patent: May 16, 2023

(54) FEFET WITH EMBEDDED CONDUCTIVE SIDEWALL SPACERS AND PROCESS FOR FORMING THE SAME

(71) Applicant: Intel Corporation, Santa Clara, CA (US)

(72) Inventors: Shriram Shivaraman, Hillsboro, OR (US); Seung Hoon Sung, Portland, OR (US); Ashish Verma Penumatcha, Beaverton, OR (US); Uygar E. Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 651 days.

(21) Appl. No.: 16/700,782

(22) Filed: Dec. 2, 2019

(65) Prior Publication Data

US 2021/0167073 A1 Jun. 3, 2021

(51) Int. Cl.
| | |
|---|---|
| *H01L 29/66* | (2006.01) |
| *H01L 29/51* | (2006.01) |
| *H01L 29/78* | (2006.01) |
| *G11C 11/22* | (2006.01) |
| *H01L 27/1159* | (2017.01) |
| *H01L 49/02* | (2006.01) |
| *H01L 27/11507* | (2017.01) |
| *G11C 5/06* | (2006.01) |

(52) U.S. Cl.
CPC .......... *H01L 27/1159* (2013.01); *G11C 5/063* (2013.01); *G11C 11/221* (2013.01); *G11C 11/223* (2013.01); *H01L 27/11507* (2013.01); *H01L 28/55* (2013.01); *H01L 29/516* (2013.01); *H01L 29/6684* (2013.01); *H01L 29/785* (2013.01); *H01L 29/78391* (2014.09)

(58) Field of Classification Search
CPC .......... H01L 27/1159; H01L 27/11507; H01L 28/55; H01L 29/6684; H01L 29/78391; H01L 29/785; H01L 29/516; G11C 5/063; G11C 11/221; G11C 11/223
See application file for complete search history.

(56) References Cited

U.S. PATENT DOCUMENTS

| | | | | |
|---|---|---|---|---|
| 10,727,366 | B2 * | 7/2020 | Jang | H01L 31/072 |
| 11,380,708 | B2 * | 7/2022 | Chang | G11C 11/2257 |
| 2019/0088760 | A1 * | 3/2019 | Lee | H01L 29/7839 |
| 2021/0184043 | A1 * | 6/2021 | Chia | H01L 29/40111 |

* cited by examiner

*Primary Examiner* — David Vu
*Assistant Examiner* — Brandon C Fox
(74) *Attorney, Agent, or Firm* — Schwabe, Williamson & Wyatt, P.C.

(57) ABSTRACT

A device is disclosed. The device includes a substrate that includes a base portion and a fin portion that extends upward from the base portion, an insulator layer on sides and top of the fin portion, a first conductor layer on a first side surface of the insulator layer, a second conductor layer on a second side surface of the insulator layer, and a ferroelectric layer on portions of a top surface of the base portion, a portion of the insulator layer below the first conductor layer, a side and top surface of the first conductor layer, a top surface of the insulator layer above the fin portion, a side and top surface of the second conductor layer, and a portion of the insulator layer below the second conductor layer. A word line conductor is on the top surface of the ferroelectric layer.

25 Claims, 5 Drawing Sheets

FEFET WITH EMBEDDED CONDUCTIVE SIDEWALL SPACERS AND PROCESS FOR FORMING THE SAME

TECHNICAL FIELD

Embodiments of the disclosure pertain to FeFET structures and, in particular, FeFET structures with embedded conductive sidewall spacers.

BACKGROUND

The memory cell is the fundamental building block of computer memory. It is an electronic circuit that stores one bit of binary information. It must be set to store a logic 1 (high voltage level) and reset to store a logic 0 (low voltage level). Its value is maintained/stored until it is changed by the program/erase process. The value in the memory cell can be accessed by reading it.

A common type of computer memory is random access memory (RAM). A type of RAM is dynamic RAM (DRAM). In one approach, a single transistor RAM memory cell is provided that includes a transistor that is integrated with a ferroelectric capacitor to form a ferroelectric memory structure. This approach has proven unsatisfactory because it can result in a non-compact integration of the ferroelectric capacitor with the transistor.

DESCRIPTION OF THE EMBODIMENTS

Figure 1A:
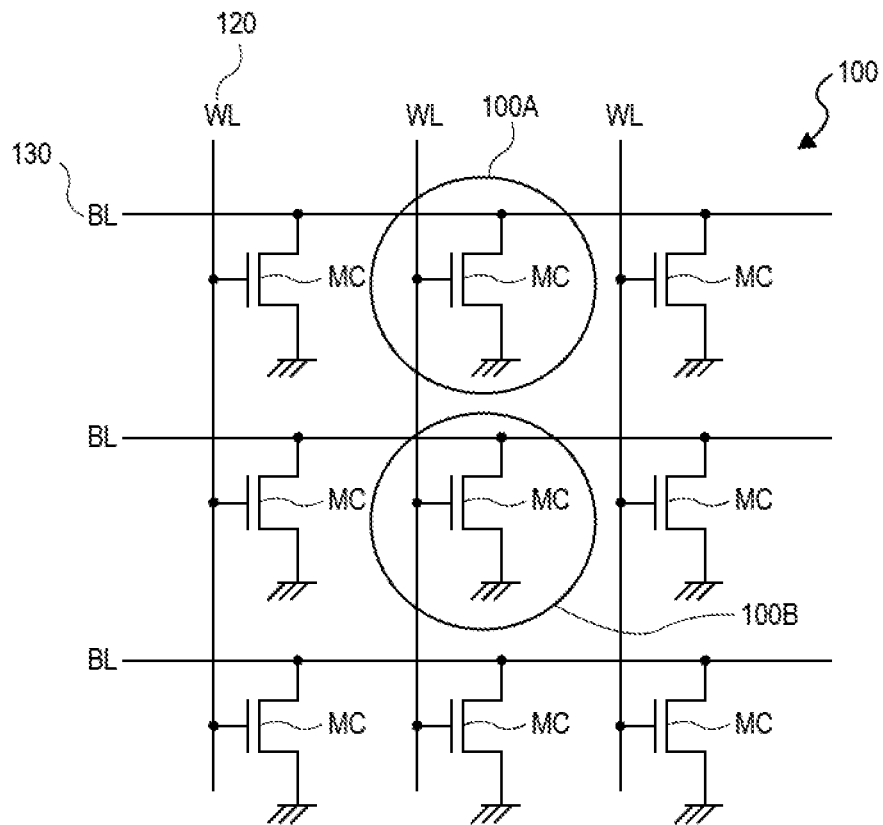
FIG. 1A illustrates an array of memory cells according to an embodiment.

FeFET structures with embedded conductor sidewall spacers are described. It should be appreciated that although embodiments are described herein with reference to example FeFET structures with embedded conductor sidewall spacers, the disclosure is more generally applicable to FeFET structures with embedded conductor sidewall spacers as well as other type FeFET structures with embedded conductor sidewall spacers. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

A common type of computer memory is random access memory (RAM). A type of RAM is dynamic RAM (DRAM). In one approach a single transistor memory cell can include a ferroelectric capacitor that is integrated with a single transistor to form a ferroelectric memory structure. However, such approaches have proven unsatisfactory because they do not provide compact integration of the ferroelectric capacitor with the transistor.

An approach that addresses the shortcomings of previous approaches is disclosed herein. In an embodiment, as part of a disclosed process, a ferroelectric capacitor with a metallic back electrode is integrated as a part of a ferroelectric single transistor memory device. In an embodiment, because of the structure of the device, polarization charge is spread uniformly across the area of the transistor's channel and variability is improved. In addition, the structure of the device, improves the endurance of the ferroelectric memory.

In an embodiment, a metallic spacer is formed inside the gate stack of the transistor below a ferroelectric insulator layer. In an embodiment, transmission electron microscopy (TEM) can be used to identify the presence of the metallic spacer and TEM-based diffraction can be used to identify the ferroelectric layer.

FIG. 1A illustrates an array 100 of memory cells according to an embodiment. In an embodiment, the memory cells (e.g., 100A and 100B) each include a single transistor. The memory cells can be accessed via the operation of word lines 120 and bit lines 130.

The memory cells store binary information and can be set to store a logic 1 (high voltage level) and reset to store a logic 0 (low voltage level). Its value is maintained/stored until it is changed by the set/reset (program/erase) process. The value in the memory cell can be accessed by reading it.

In an embodiment, the single transistor of the memory cells (e.g., 100A and 100B) includes a metallic back electrode as part of the ferroelectric capacitor that is integrated to form a single transistor ferroelectric memory device. In an embodiment, the manner in which the single transistor ferroelectric memory device is formed (see FIGS. 2A-2C) and constituted results in compact integration of the ferroelectric capacitor with the transistor.

Figure 1B:
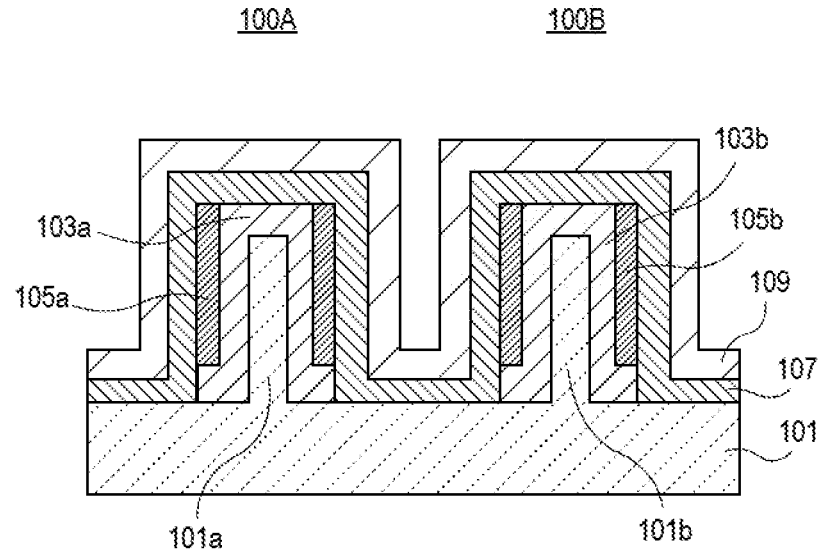
FIG. 1B illustrates a cross-sectional view of a pair of memory cells according to an embodiment.

FIG. 1B illustrates a cross-sectional view of a pair of memory cells 100A and 100B according to an embodiment. In the FIG. 1B embodiment, memory cells 100A and 100B include substrate 101, fin 101a, fin 101b, interfacial dielectric layer 103a, interfacial dielectric layer 103b, embedded conductor 105a, embedded conductor 105b, ferroelectric layer 107, and word line conductor 109.

Referring to FIG. 1B, in an embodiment, the substrate 101 includes the fin 101a, and the fin 101b, that each extend vertically upward from the substrate 101. In an embodiment, the interfacial dielectric layer 103a and the interfacial dielectric layer 103b may be present on the top and the side portions of the fin 101a and the fin 101b respectively. In an embodiment, the embedded conductor 105a and the embedded conductor 105b can be formed on the side portions of the interfacial dielectric layer 103a and the interfacial dielectric layer 103b respectively. In an embodiment, the thickness of the interfacial dielectric layers 103a and 103b can be from 1 to 10 nm on the side portions of the fin 101a and the fin 101b and 0 to 10 nm on the top portion of the fin 101a and the fin 101b. In other embodiments, the interfacial dielectric layers 103a and 103b can have other thicknesses. In an embodiment, the ferroelectric layer 107 can be formed to cover the outer sides and top of the embedded conductors 105a and 105b, the portions of the interfacial dielectric layers 103a and 103b below the embedded conductors 105a and 105b, a top surface of the interfacial dielectric layers 103a and 103b above the fin 101a and the fin 101b, and portions of the top surface of the substrate 101. In an embodiment, the word line conductor 109 can cover the top surface of the ferroelectric layer 107.

Referring to FIG. 1B, in an embodiment, the substrate 101 can be formed from silicon or silicon germanium. In other embodiments, the substrate 101 can be formed from other material. In an embodiment, the interfacial dielectric layers 103a and 103b can be formed from oxide. In other embodiments, the interfacial dielectric layers 103a and 103b can be formed from other materials. In an embodiment, the embedded conductors 105a and 105b can be formed from TiN, TaN, W, T or Ta. In other embodiments, the embedded conductors 105a and 105b can be formed from other materials. In an embodiment, the embedded conductors 105a and 105b can include nanocrystalline, microcrystalline or polycrystalline grain structures. In an embodiment, the embedded conductors 105a and 105b encourage ferroelectric phase formation in the ferroelectric layer 107 above them upon anneal. In an embodiment, the embedded conductors 105a and 105b can be dry etchable. In an embodiment, the embedded conductors 105a and 105b can be amenable to an anisotropic directional etch. In an embodiment, the ferroelectric layer 107 can be formed from H In other embodiments, the ferroelectric layer 107 can be formed from other materials such as perovskites or doped Hafnium oxide. In an embodiment, as discussed above, the ferroelectric layer 107 can be annealed after it is formed. In an embodiment, the word line conductor 109 can be formed from hafnium, zirconium, titanium, tantalum, tungsten, aluminum, ruthenium, palladium, platinum, cobalt, or nickel. In other embodiments, the word line conductor 109 can be formed from other materials.

In operation, the ferroelectric layer 107 can be used as a memory storage element of the memory cells 100A and 100B. In an embodiment, the memory cells 100A and 100B can store binary information and can be set to store a logic 1 and reset to store a logic 0. In an embodiment, the memory cell value can be maintained/stored until it is changed by the program/erase process. The memory cell value can be accessed by reading. In an embodiment, because the embedded conductors 105a and 105b are conductors, ferroelectric polarization charge can be distributed uniformly across the embedded conductors 105a and 105b. This causes a uniform induction of charge in the channel and variability of the FeFET is improved. For example, in an embodiment, even if only a small part of the ferroelectric layer 107 is polarized, counterwcharge will still be uniformly distributed over the embedded conductors 105a and 105b, and uniform formation of charge in the channel can be achieved. Moreover, in an embodiment, because of the presence of the embedded conductors 105a and 105b, the endurance of the memory cells 100A and 100B can be improved. In an embodiment, the embedded conductors 105a and 105b function as back electrodes of the ferroelectric capacitor (the word line operates as the other capacitor electrode).

Figure 2A:
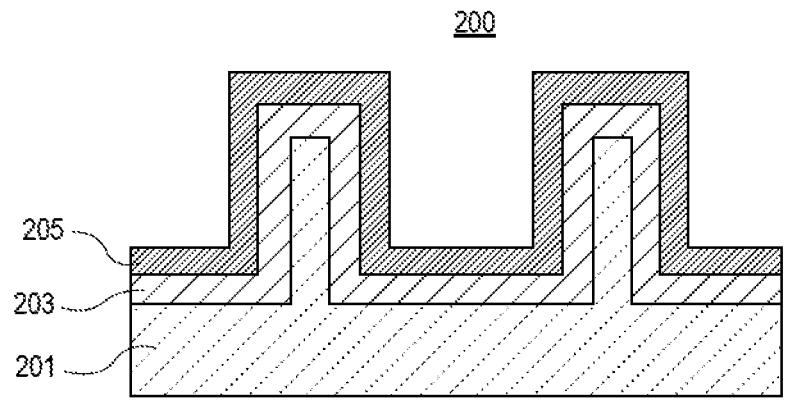
FIGS. 2A-2C illustrate a process for forming a FeFET with conductor sidewall spacers according to an embodiment.
Figure 2B:
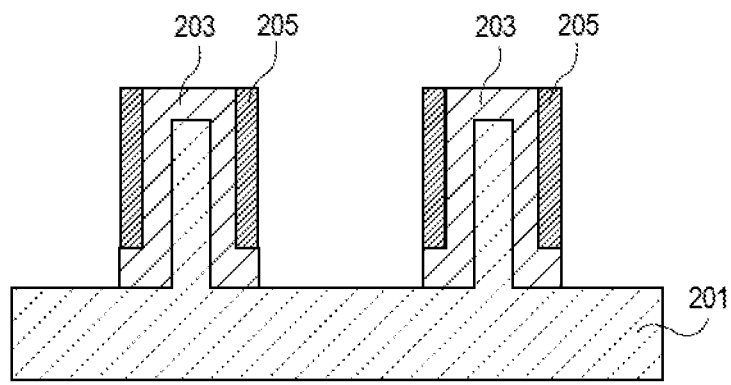
Figure 2C:
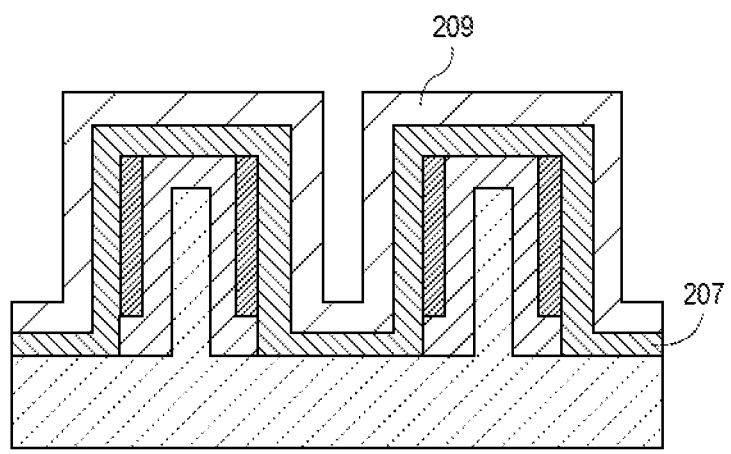

FIGS. 2A-2C illustrate a process for forming a FeFET with conductor sidewall spacers according to an embodiment. Referring to FIG. 2A, after one or more operations semiconductor structure 200 is formed. In an embodiment, the semiconductor structure 200 includes substrate 201, interfacial dielectric layer 203, and conductor 205.

In an embodiment, the substrate 201 can be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention. In an embodiment, fins are formed in the substrate 201 (see FIG. 2A).

In an embodiment, the interfacial dielectric layer 203 can be formed by deposition over the substrate 201 and the fins formed therein. In an embodiment, the conductor 205 can be formed by deposition over the interfacial dielectric layer 203. In an embodiment, the interfacial dielectric layer 203 and conductor 205 can be formed using a dry etchable material. In an embodiment, the interfacial dielectric layer 203 and the conductor 205 can be formed by atomic layer deposition (ALD). In an embodiment, the interfacial dielectric layer 203 and the conductor 205 can be formed by physical vapor deposition (PVD) or a combination of atomic layer deposition (ALD) and PVD. In still other embodiments, the interfacial dielectric layer 203 and the conductor 205 can be formed by chemical vapor deposition (CVD).

Referring to FIG. 2B, subsequent to one or more operations that result in the cross-section shown in FIG. 2A, an anisotropic etch of the interfacial dielectric layer 203 and the conductor 205 can be performed. In an embodiment, the interfacial dielectric layer 203 and the conductor 205 can be etched using an anisotropic dry etching process. In an embodiment, as part of the etching process, portions of the interfacial dielectric layer 203 and the conductor 205 parallel to the substrate 201 between the fins is removed. In addition, the portions of the conductor 205 located above the top of the fins is removed. In an embodiment, the portions of the interfacial dielectric layer 203 on the top portion of the fins may not be removed during the etch. In other embodiments, the portions of the interfacial dielectric layer 203 on the top portion of the fins may be removed during the etch. In an embodiment, the anisotropic etching of the interfacial dielectric layer 203 and the conductor 205 results in the formation of spacers on side surfaces of the fins.

Referring to FIG. 2C, subsequent to one or more operations that result in the cross-section shown in FIG. 2B, a ferroelectric layer 207 is formed on exposed surfaces of the substrate 201, side and top surfaces of the remaining parts of the conductor 205 (embedding the conductor), the remaining portions of the interfacial dielectric layer 203 below the remaining parts of the conductor 205 (on each side of the fin), and the top surface of the remaining parts of the interfacial dielectric layer 203 above the fin. In addition, a word line conductor 209 is formed above the ferroelectric layer 207. In an embodiment, the ferroelectric layer 207 can be formed by atomic layer deposition (ALD), physical vapor deposition (PVD), chemical vapor deposition (CVD), electrochemical deposition (ECD), or molecular beam epitaxy (MBE). In other embodiments, the ferroelectric layer 207 can be formed in other manners.

In an embodiment, the word line conductor 209 can be formed by atomic layer deposition (ALD), physical vapor deposition (PVD), chemical vapor deposition (CVD), electrochemical deposition (ECD), or molecular beam epitaxy (MBE). In other embodiments, the word line conductor 209 can be formed in other manners. In an embodiment, subsequent to the formation of the word line conductor 209 an anneal can be performed. In other embodiments, the anneal can be performed after the formation of the ferroelectric layer 207. In an embodiment, the anneal can cause the ferroelectric material to assume a ferroelectric phase.

Figure 3:
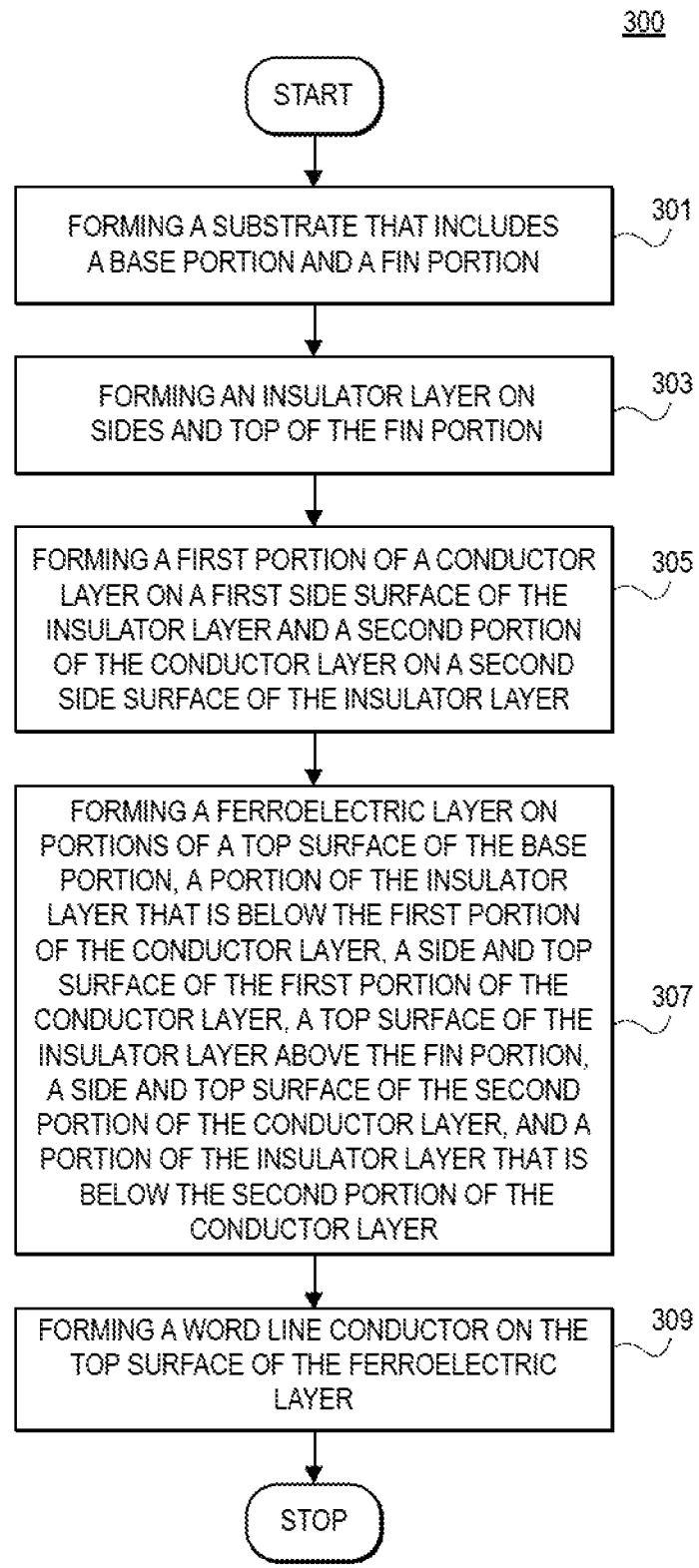
FIG. 3 illustrates a flowchart of a method for forming a FeFET with conductor sidewall spacers according to an embodiment.

FIG. 3 illustrates a flowchart of a method for forming a FeFET with conductor sidewall spacers according to an embodiment. In an embodiment, the method includes, at 301, forming a substrate that includes a base portion and a fin portion. In an embodiment, the fin portion extends upward from the base portion. At 303, forming an insulator layer on sides and top of the fin portion. At 305, forming a first portion of a conductor layer on a first side surface of the insulator layer and a second portion of the conductor layer on a second side surface of the insulator layer. At 307, forming a ferroelectric layer on portions of a top surface of the base portion, a portion of the insulator layer that is below the first portion of the conductor layer, a side and top surface of the first portion of the conductor layer, a top surface of the insulator layer above the fin portion, a side and top surface of the second portion of the conductor layer, and a portion of the insulator layer that is below the second portion of the conductor layer. At 309, forming a word line conductor on the top surface of the ferroelectric layer.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, (This invention is specific to FinFET geometry transistors) although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

Figure 4:
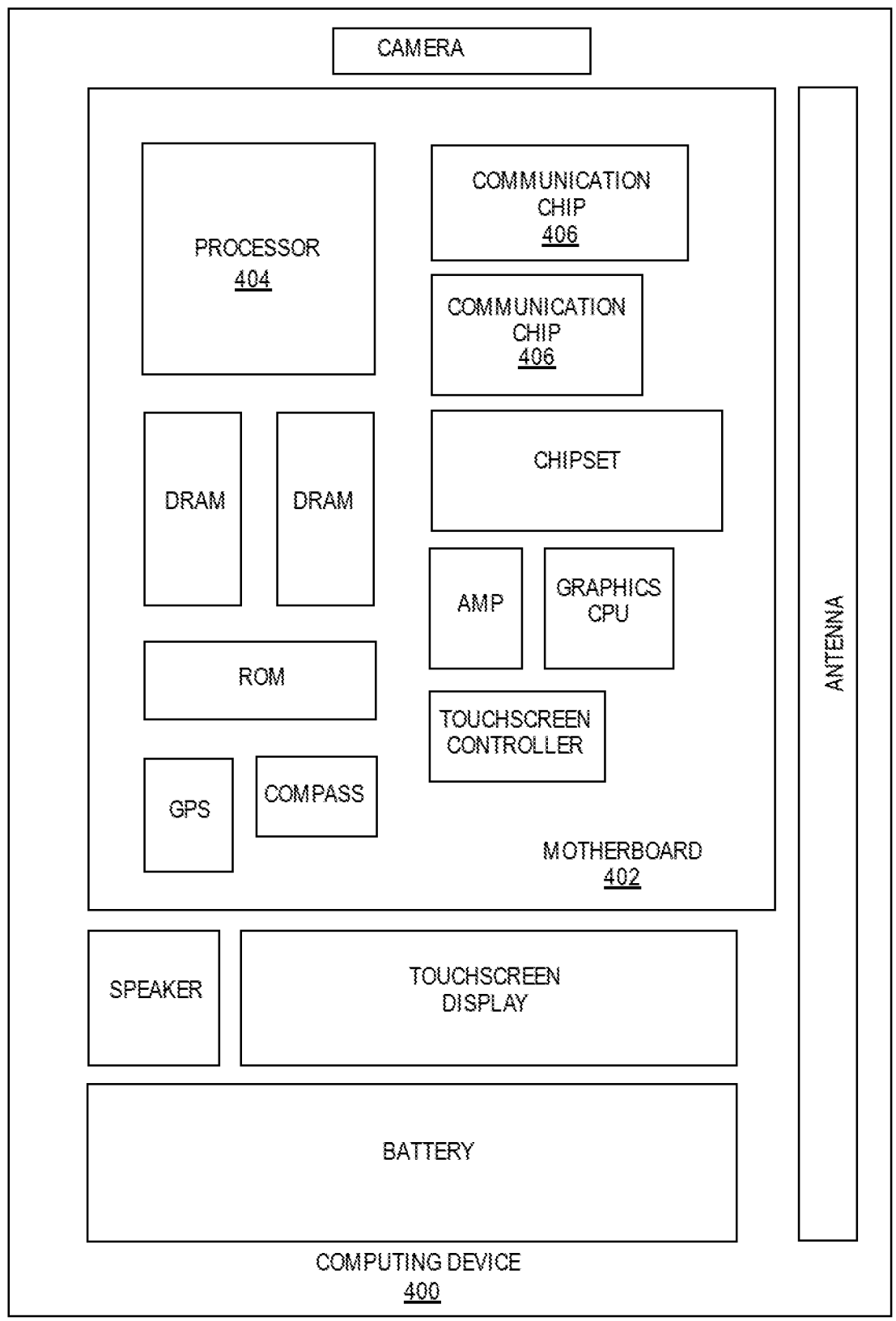
FIG. 4 illustrates a computing device in accordance with one implementation of the invention.

FIG. 4 illustrates a computing device 400 in accordance with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices, such as MOS-FET transistors built in accordance with implementations of the invention.

In further implementations, another component housed within the computing device 400 may contain an integrated circuit die that includes one or more devices, such as MOS-FET transistors built in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
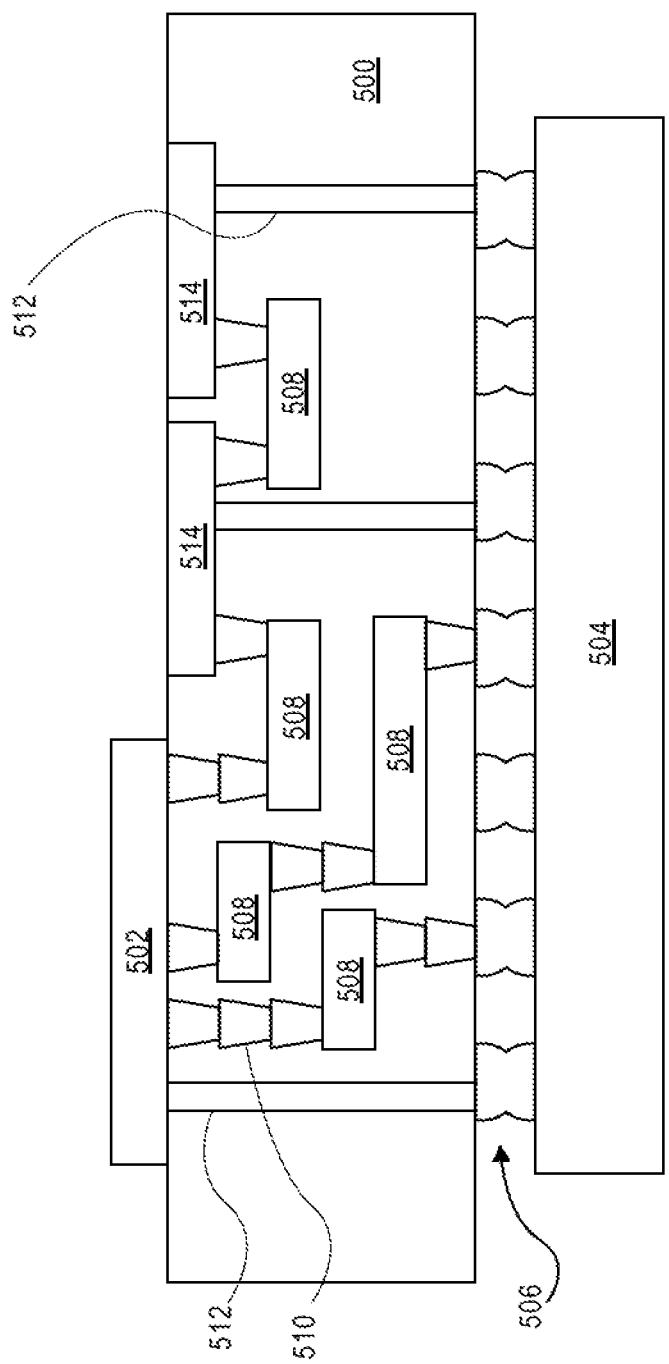
FIG. 5 illustrates an interposer that includes one or more embodiments of the invention.

FIG. 5 illustrates an interposer 500 that includes one or more embodiments of the invention. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer 500 may be formed of alternate rigid or flexible materials that may include the same materials described above for use in a semiconductor substrate, such as silicon, germanium, and other group III-V and group IV materials.

The interposer 500 may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the invention, apparatuses or processes disclosed herein may be used in the fabrication of interposer 500.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A device, comprising: a substrate that includes a base portion and a fin portion that extends upward from the base portion; an insulator layer on sides and top of the fin portion; a first conductor layer on a first side surface of the insulator layer; a second conductor layer on a second side surface of the insulator layer; a ferroelectric layer on portions of a top surface of the base portion, a portion of the insulator layer below the first conductor layer, a side and top surface of the first conductor layer, a top surface of the insulator layer above the fin portion, a side and top surface of the second conductor layer, and a portion of the insulator layer below the second conductor layer; and a word line conductor on the top surface of the ferroelectric layer.

Example embodiment 2: The device of example embodiment 1, wherein the first conductor layer and the second conductor layer are metallic spacers that separate portions of the insulator layer on sides of the fin portion from the ferroelectric layer.

Example embodiment 3: The device of example embodiment 1, or 2, wherein the ferroelectric layer is part of a ferroelectric capacitor.

Example embodiment 4: The device of example embodiment 1, 2, or 3, wherein the first conductor layer and the second conductor layer have a thickness of 1 to 10 nm.

Example embodiment 5: The device of example embodiment 1, 2, 3, or 4, wherein the first conductor layer and the conductor layer are formed from TiN, TaN, Tungsten, Ti or Ta.

Example embodiment 6: The device of example embodiment 1, 2, 3, 4, or 5, wherein the first conductor layer and the second conductor layer includes a polycrystalline grain structure.

Example embodiment 7: The device of example embodiment 1, 2, 3, 4, 5, or 6, wherein the device includes a memory component.

Example embodiment 8: A system, comprising: one or more processing components; and one or more storage components, at least one of the one or more processing components and the one or more storage components including a device comprising: a substrate that includes a base portion and a fin portion that extends upward from the base portion; an insulator layer on sides and top of the fin portion; a first conductor layer on a first side surface of the insulator layer; a second conductor layer on a second side surface of the insulator layer; a ferroelectric layer on portions of a top surface of the base portion, a portion of the insulator layer below the first conductor layer, a side and top surface of the first conductor layer, a top surface of the insulator layer above the fin portion, a side and top surface of the second conductor layer, and a portion of the insulator layer below the second conductor layer; and a word line conductor on the top surface of the ferroelectric layer.

Example embodiment 9: The system of example embodiment 8, wherein the first conductor layer and the second conductor layer are metallic spacers that separate portions of the insulator layer on sides of the fin portion from the ferroelectric layer.

Example embodiment 10: The system of example embodiment 8, or 9, wherein the ferroelectric layer is part of a ferroelectric capacitor.

Example embodiment 11: The system of example embodiment 8, 9, or 10, wherein the first conductor layer and the second conductor layer have a thickness of 1 to 10 nm.

Example embodiment 12: The system of example embodiment 8, 9, 10, or 11, wherein the first conductor layer and the second conductor layer are formed from TiN, TaN, Tungsten, Ti or Ta.

Example embodiment 13: The system of example embodiment 8, 9, 10, 11, or 12, wherein the first conductor layer and the second conductor layer includes a polycrystalline grain structure.

Example embodiment 14: The system of example embodiment 8, 9, 10, 11, 12, or 13, wherein the device includes a memory component.

Example embodiment 15: A method, comprising: forming a substrate that includes a base portion and a fin portion that extends upward from the base portion; forming an insulator layer on sides and top of the fin portion; forming a first portion of a conductor layer on a first side surface of the insulator layer, and a second portion of the conductor layer on a second side surface of the insulator layer; forming a ferroelectric layer on portions of a top surface of the base portion, a portion of the insulator layer that is below the first portion of the conductor layer, a side and top surface of the first portion of the conductor layer, a top surface of the insulator layer above the fin portion, a side and top surface of the second portion of the conductor layer, and a portion of the insulator layer that is below the second portion of the conductor layer; and forming a word line conductor on the top surface of the ferroelectric layer.

Example embodiment 16: The method of example embodiment 15, wherein the first portion of the conductor layer and the second portion of the conductor layer are metallic spacers.

Example embodiment 17: The method of example embodiment 15, or 16, wherein the ferroelectric layer is part of a ferroelectric capacitor.

Example embodiment 18: The method of example embodiment 15, 16, or 17, wherein the first portion of the conductor layer and the second portion of the conductor layer have a thickness of 1 to 10 nm.

Example embodiment 19: The method of example embodiment 15, 16, 17, or 18, wherein the first portion of the conductor layer and the second portion of the conductor layer are formed from TiN, TaN, Tungsten, Ti or Ta.

Example embodiment 20: The method of example embodiment 15, 16, 17, 18, or 19, wherein the first portion of the conductor layer and the second portion of the conductor layer includes a polycrystalline grain structure.

Example embodiment 21: The method of example embodiment 15, 16, 17, 18, 19, or 20, wherein the method includes forming a memory component.

Example embodiment 22: A method, comprising: forming a substrate that includes a base and a fin that extends upward from the base; forming an insulator layer on the base and on side and top portions of the fin; forming a first conductor layer above the insulator layer; removing portions of the insulator layer on a top surface of the base and portions of the conductor layer on the insulator layer on the top surface of the base and above the fin; forming a ferroelectric layer on exposed portions of the base, exposed portions of the insulator layer, and top and side surfaces of remaining portions of the first conductor layer; and forming a second conductor layer on the ferroelectric layer.

Example embodiment 23: The method of example embodiment 22, wherein the removing includes an anisotropic directional etch.

Example embodiment 24: The method of example embodiment 22, wherein the first conductor layer has a thickness of 1 to 10 nm.

Example embodiment 25: The method of example embodiment 22, wherein the first conductor layer is formed from TiN, TaN, Tungsten, Ti or Ta.

What is claimed is:

1. A device, comprising:
    a substrate that includes a base portion and a fin portion that extends upward from the base portion;
    an insulator layer on sides and top of the fin portion;
    a first conductor layer on a first side surface of the insulator layer;
    a second conductor layer on a second side surface of the insulator layer;
    a ferroelectric layer on portions of a top surface of the base portion, a portion of the insulator layer below the first conductor layer, a side and top surface of the first conductor layer, a top surface of the insulator layer above the fin portion, a side and top surface of the second conductor layer, and a portion of the insulator layer below the second conductor layer; and
    a word line conductor on the top surface of the ferroelectric layer.

2. The device of claim 1, wherein the first conductor layer and the second conductor layer are metallic spacers that separate portions of the insulator layer on sides of the fin portion from the ferroelectric layer.

3. The device of claim 1, wherein the ferroelectric layer is part of a ferroelectric capacitor.

4. The device of claim 1, wherein the first conductor layer and the second conductor layer have a thickness of 1 to 10 nm.

5. The device of claim 1, wherein the first conductor layer and the second conductor layer are formed from TiN, TaN, Tungsten, Ti or Ta.

6. The device of claim 1, wherein the first conductor layer and the second conductor layer includes a polycrystalline grain structure.

7. The device of claim 1, wherein the device includes a memory component.

8. A system, comprising: one or more processing components; and one or more storage components, at least one of the one or more processing components and the one or more storage components including a device comprising:
   a substrate that includes a base portion and a fin portion that extends upward from the base portion;
   an insulator layer on sides and top of the fin portion;
   a first conductor layer on a first side surface of the insulator layer;
   a second conductor layer on a second side surface of the insulator layer;
   a ferroelectric layer on portions of a top surface of the base portion, a portion of the insulator layer below the first conductor layer, a side and top surface of the first conductor layer, a top surface of the insulator layer above the fin portion, a side and top surface of the second conductor layer, and a portion of the insulator layer below the second conductor layer; and
   a word line conductor on the top surface of the ferroelectric layer.

9. The system of claim 8, wherein the first conductor layer and the second conductor layer are metallic spacers that separate portions of the insulator layer on sides of the fin portion from the ferroelectric layer.

10. The system of claim 8, wherein the ferroelectric layer is part of a ferroelectric capacitor.

11. The system of claim 8, wherein the first conductor layer and the second conductor layer have a thickness of 1 to 10 nm.

12. The system of claim 8, wherein the first conductor layer and the second conductor layer are formed from TiN, TaN, Tungsten, Ti or Ta.

13. The system of claim 8, wherein the first conductor layer and the second conductor layer includes a polycrystalline grain structure.

14. The system of claim 8, wherein the device includes a memory component.

15. A method, comprising:
   forming a substrate that includes a base portion and a fin portion that extends upward from the base portion;
   forming an insulator layer on sides and top of the fin portion;
   forming a first portion of a conductor layer on a first side surface of the insulator layer and a second portion of the conductor layer on a second side surface of the insulator layer;
   forming a ferroelectric layer on portions of a top surface of the base portion, a portion of the insulator layer that is below the first portion of the conductor layer, a side and top surface of the first portion of the conductor layer, a top surface of the insulator layer above the fin portion, a side and top surface of the second portion of the conductor layer, and a portion of the insulator layer that is below the second portion of the conductor layer; and
   forming a word line conductor on the top surface of the ferroelectric layer.

16. The method of claim 15, wherein the first portion of the conductor layer and the second portion of the conductor layer are metallic spacers.

17. The method of claim 15, wherein the ferroelectric layer is part of a ferroelectric capacitor.

18. The method of claim 15, wherein the first portion of the conductor layer and the second portion of the conductor layer have a thickness of 1 to 10 nm.

19. The method of claim 15, wherein the first portion of the conductor layer and the second portion of the conductor layer are formed from TiN, TaN, Tungsten, Ti or Ta.

20. The method of claim 15, wherein the first portion of the conductor layer and the second portion of the conductor layer includes a polycrystalline grain structure.

21. The method of claim 15, wherein the method forms a memory component.

22. A method, comprising:
   forming a substrate that includes a base and a fin that extends upward from the base;
   forming an insulator layer on the base and on side and top portions of the fin;
   forming a first conductor layer above the insulator layer;
   removing portions of the insulator layer on a top surface of the base and portions of the first conductor layer on the insulator layer on the top surface of the base and above the fin;
   forming a ferroelectric layer on exposed portions of the base, exposed portions of the insulator layer, and top and side surfaces of remaining portions of the first conductor layer; and
   forming a second conductor layer on the ferroelectric layer.

23. The method of claim 22, wherein the removing is by anisotropic directional etch.

24. The method of claim 22, wherein the first conductor layer has a thickness of 1 to 10 nm.

25. The method of claim 22, wherein the first conductor layer is formed from TiN, TaN, Tungsten, Ti or Ta.

* * * * *